United States Patent
Park et al.

(10) Patent No.: US 12,283,338 B2
(45) Date of Patent: Apr. 22, 2025

(54) GLOBAL DATA LINE OF MULTI-ARRAY SYNCHRONOUS RANDOM ACCESS MEMORY (SRAM)

(71) Applicant: Samsung Electronics Co., Ltd., Suwon-si (KR)

(72) Inventors: Hee Choul Park, San Jose, CA (US); Bin Xie, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 211 days.

(21) Appl. No.: 18/076,388

(22) Filed: Dec. 6, 2022

(65) Prior Publication Data
US 2023/0352062 A1 Nov. 2, 2023

Related U.S. Application Data

(60) Provisional application No. 63/336,918, filed on Apr. 29, 2022.

(51) Int. Cl.
*G11C 7/00* (2006.01)
*G11C 7/06* (2006.01)
*G11C 7/10* (2006.01)
*G11C 7/12* (2006.01)

(52) U.S. Cl.
CPC ............ *G11C 7/067* (2013.01); *G11C 7/1039* (2013.01); *G11C 7/12* (2013.01)

(58) Field of Classification Search
CPC .................................................. G11C 7/1051
USPC ................................................... 365/189.05
See application file for complete search history.

(56) References Cited

U.S. PATENT DOCUMENTS

| | | | |
|---|---|---|---|
| 4,322,824 A | 3/1982 | Allan | |
| 7,158,432 B1 * | 1/2007 | Hunter | G11C 7/1048 365/207 |
| 7,339,850 B2 | 3/2008 | Morishima | |
| 9,786,360 B2 | 10/2017 | Koike | |
| 11,322,200 B1 * | 5/2022 | Raj | G11C 11/418 |
| 2007/0014171 A1 * | 1/2007 | Ha | G11C 7/1069 365/208 |
| 2016/0267963 A1 * | 9/2016 | Koike | G11C 7/12 |
| 2022/0028451 A1 | 1/2022 | Shin | |

FOREIGN PATENT DOCUMENTS

WO   2014105013 A1   7/2014

* cited by examiner

*Primary Examiner* — Hoai V Ho
(74) *Attorney, Agent, or Firm* — Renaissance IP Law Group LLP (57) ABSTRACT

Various aspects include a circuit having a single-rail static-operation global data line of a synchronous random access memory (SRAM). The circuit can include one or more automatic three-state drivers coupled to the single-rail static operation global data line of the SRAM. The circuit can include one or more sense amplifiers coupled to the one or more automatic three-state drivers. The circuit can include a latch coupled to the single-rail static-operation global data line. Some embodiments can include a method for operating a global data line of a multi-array SRAM. The method can include connecting a single-rail static-operation global data line of the SRAM to one or more automatic three-state drivers of the SRAM, and operating the one or more automatic three-state drivers without a gating signal. The method can include operating the single-rail global data line of the SRAM with a static signal.

16 Claims, 5 Drawing Sheets

GLOBAL DATA LINE OF MULTI-ARRAY SYNCHRONOUS RANDOM ACCESS MEMORY (SRAM)

RELATED APPLICATION DATA

This application claims the benefit of U.S. Provisional Application Ser. No. 62/336,918, filed on Apr. 29, 2022, which is hereby incorporated by reference.

TECHNICAL AREA

The present embodiments relate to synchronous random access memory (SRAM), and more particularly, to a global data line of multi-array SRAM.

BACKGROUND

High-density SRAM devices that have more than two sub-arrays may use a global data line to get output data from a bit cell of a sub-array. The global data line may have a heavy load because the global data line may be running across different bit cells of different sub-arrays, such as Block 0 through Block 3. The load placed on the global data line consumes a significant portion of total timing and power budgets of the SRAM devices.

BRIEF SUMMARY

Various aspects include a circuit having a single-rail static-operation global data line of a synchronous random access memory (SRAM). The circuit can include one or more automatic three-state drivers coupled to the single-rail static operation global data line of the SRAM. The circuit can include one or more sense amplifiers coupled to the one or more automatic three-state drivers. The circuit can include a latch coupled to the single-rail static-operation global data line.

Some embodiments can include a method for operating a global data line of a multi-array SRAM. The method can include connecting a single-rail static-operation global data line of the SRAM to one or more automatic three-state drivers of the SRAM, and operating the one or more automatic three-state drivers without a gating signal. The method can include operating the single-rail global data line of the SRAM with a static signal.

BRIEF DESCRIPTION OF THE DRAWINGS

The foregoing and additional features and advantages of the present disclosure will become more readily apparent from the following detailed description, made with reference to the accompanying figures, in which.

DETAILED DESCRIPTION

Reference will now be made in detail to embodiments disclosed herein, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments disclosed herein include components of a multi-array SRAM with better power characteristics and improved channel availability. The components of the SRAM disclosed herein can include one or more circuits having a single-rail static-operation global data line, a static signal, and one or more automatic three-state drivers that function using a dynamic operation.

Figure 1:
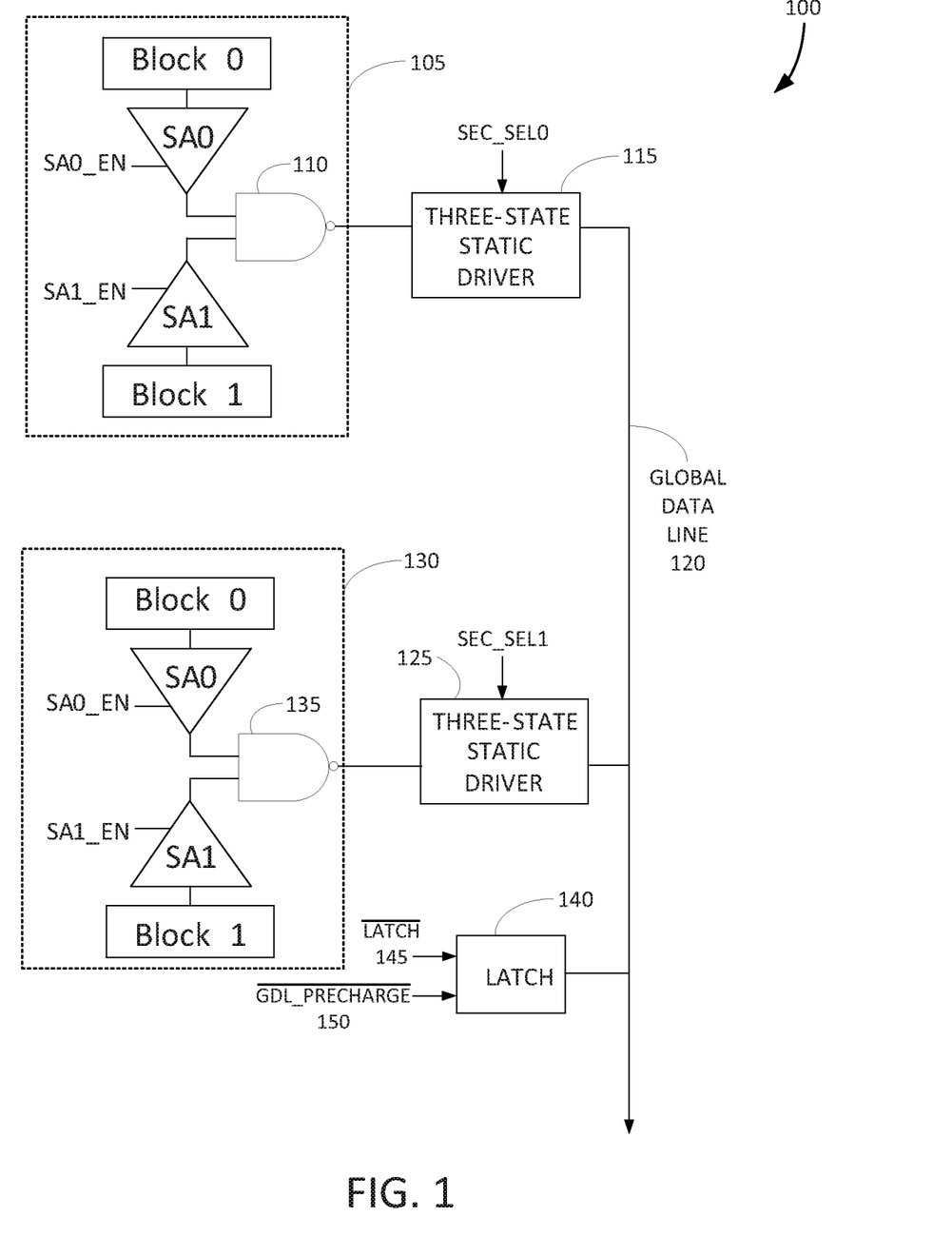
FIG. 1 illustrates a circuit in accordance with some embodiments disclosed herein.

FIG. 1 illustrates a circuit 100 in accordance with some embodiments disclosed herein. The circuit 100 can include a first section 105 having a first sense amplifier (amp) SA0 and a second sense amp SA1. The first sense amp SA0 can receive a sense amp enable SA0_EN input signal. The second sense amp SA1 can receive a sense amp enable SA1_EN input signal. The first sense amp SA0 can be coupled to one or more bit lines associated with Block 0. The second sense amp SA1 can be coupled to one or more bit lines associated with Block 1. An output of the first sense amp SA0 can be coupled to a first input of a NAND gate 110. An output of the second sense amp SA1 can be coupled to a second input of the NAND gate 110. An output of the NAND gate 110 can be coupled to a first three-state static driver 115.

The first three-state static driver 115 can receive a gating signal (i.e., SEC_SEL0). The first three-state static driver 115 can be coupled to a global data line 120. The global data line 120 can be coupled to a second three-state static driver 125. The second three-state static driver 125 can receive a gating signal (i.e., SEC_SEL1). The circuit 100 can include a second section 130 having a first sense amp SA0 and a second sense amp SA1 The second section 130 can be coupled to the second three-state static driver 125.

The first sense amp SA0 of the second section 130 can be coupled to one or more bit lines associated with Block 0 of the second section 130. The second sense amp SA1 of the second section 130 can be coupled to one or more bit lines associated with Block 1 of the second section 130. An output of the first sense amp SA0 of the second section 130 can be coupled to a first input of a NAND gate 135. An output of the second sense amp SA1 of the second section 130 can be coupled to a second input of the NAND gate 135. An output of the NAND gate 135 can be coupled to the second three-state static driver 125. The global data line 120 can be coupled to a latch 140. The latch 140 can receive a latch signal 145 (e.g., LATCH not) and a global data line pre-charge signal 150 (e.g., GDL_PRECHARGE not).

Figure 2:
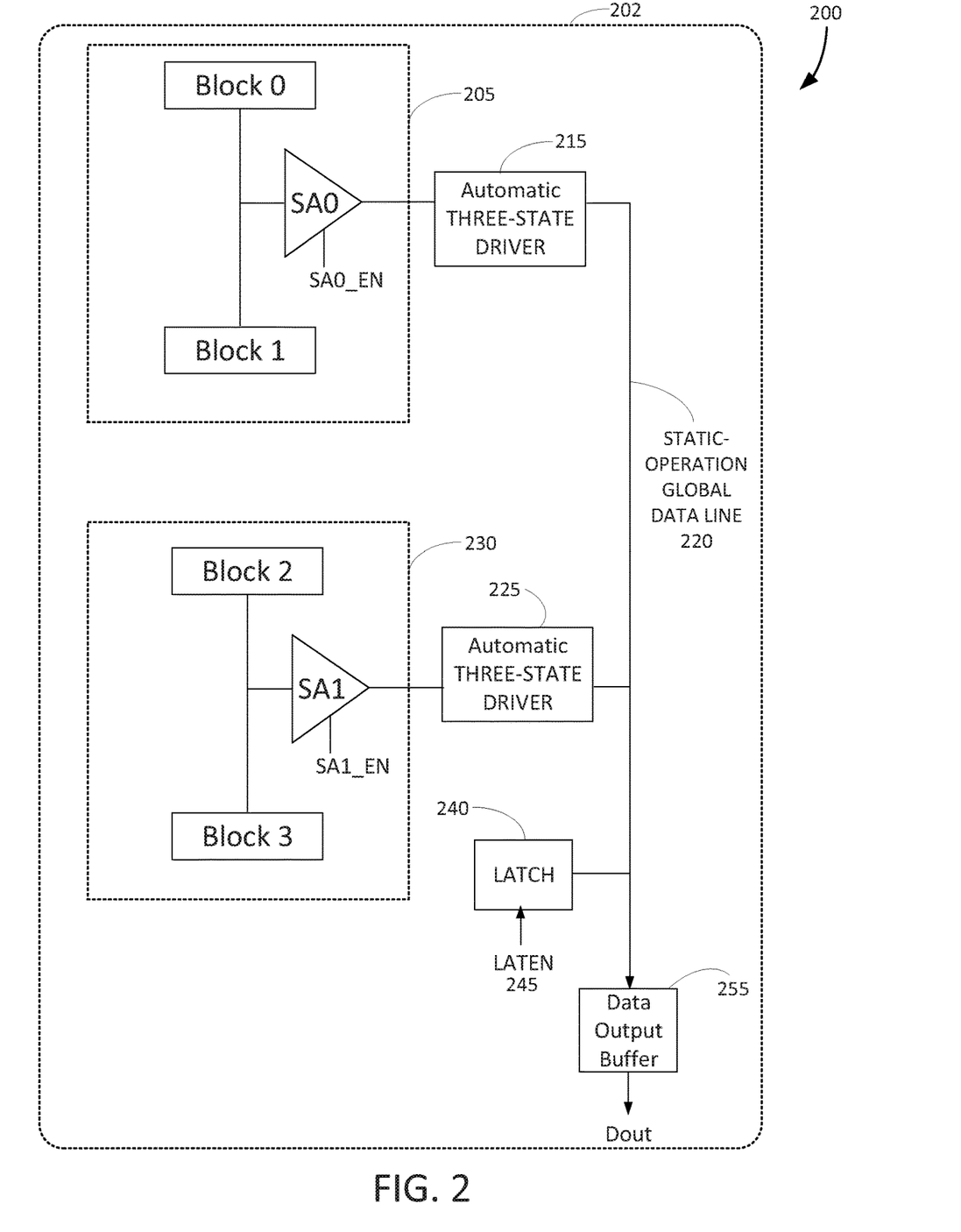
FIG. 2 illustrates a circuit including automatic three-state drivers of an SRAM in accordance with some embodiments disclosed herein.

FIG. 2 illustrates a circuit 200 including automatic three-state dynamic drivers (e.g., 215, 225) of an SRAM 202 in accordance with some embodiments disclosed herein. For improved power characteristics and channel availability, a single-rail static-operation global data line 220 is better than a dual-rail global data line. In order to reduce power, a static signal on the global data line 220 is better than a dynamic (i.e., pulsed) signal. A static operation global data line may be characterized by high (H)/low (L) signal transitions H→L, H→H, L→H, and L→L. In contrast, a dynamic operation global data line may be characterized by H/L signal transitions H→L, H→H, L→H, and L→H→L. In order to improve circuit speed characteristics, the automatic three-state drivers (e.g., 215, 225) are better than a static driver.

The circuit 200 can include a first section 205 having a sense amp SA0. The sense amp SA0 can receive an SA0_EN input signal. The sense amp SA0 can be coupled to one or more bit lines associated with Block 0. Alternatively or in addition, the sense amp SA0 can be coupled to one or more bit lines associated with Block 1. An output of the sense amp SA0 can be directly coupled to a first automatic three-state driver 215. The section 205 of the circuit 200 need not include a NAND gate like the section 105 of the circuit 100. The first automatic three-state driver 215 need not include a gating signal such as the gating signal SEC_SEL0 of the circuit 100.

The first automatic three-state driver 215 can receive an output signal from the sense amp SA0. The first automatic three-state driver 215 can be coupled to a single-rail static-operation global data line 220. The single-rail static-operation global data line 220 can be coupled to a second automatic three-state driver 225. The circuit 200 can include a second section 230 having a sense amp SA1 The sense amp SA1 can receive an input signal (e.g., SA1_EN). The second section 230 can be coupled to the second automatic three-state driver 225. The second automatic three-state driver 225 need not include a gating signal such as the gating signal SEC_SEL1 of the circuit 100. The three-state drivers (e.g., 215, 225) are automatic because they convert a dynamic signal to a static signal without any gating signal.

The sense amp SA1 of the second section 230 can be coupled to one or more bit lines associated with Block 2 of the second section 230. Alternatively or in addition, the sense amp SA1 of the second section 230 can be coupled to one or more bit lines associated with Block 3 of the second section 230. An output of the sense amp SA1 of the second section 230 can be directly coupled to the automatic three-state driver 225. The section 230 of the circuit 200 need not include a NAND gate like the section 130 of the circuit 100.

The single-rail static-operation global data line 220 can be coupled to a latch 240. The latch 240 can receive a latch enable signal 245 (e.g., LATEN). The latch 240 need not receive a global data line pre-charge signal 150 like the latch 140 of the circuit 100, and the single-rail static-operation global data line 220 need not be pre-charged given its static operation rather than pulsed operation. The circuit 200 can include a data output buffer 255 coupled to the single-rail static-operation global data line 220, which can output an output signal Dout.

Figure 3:
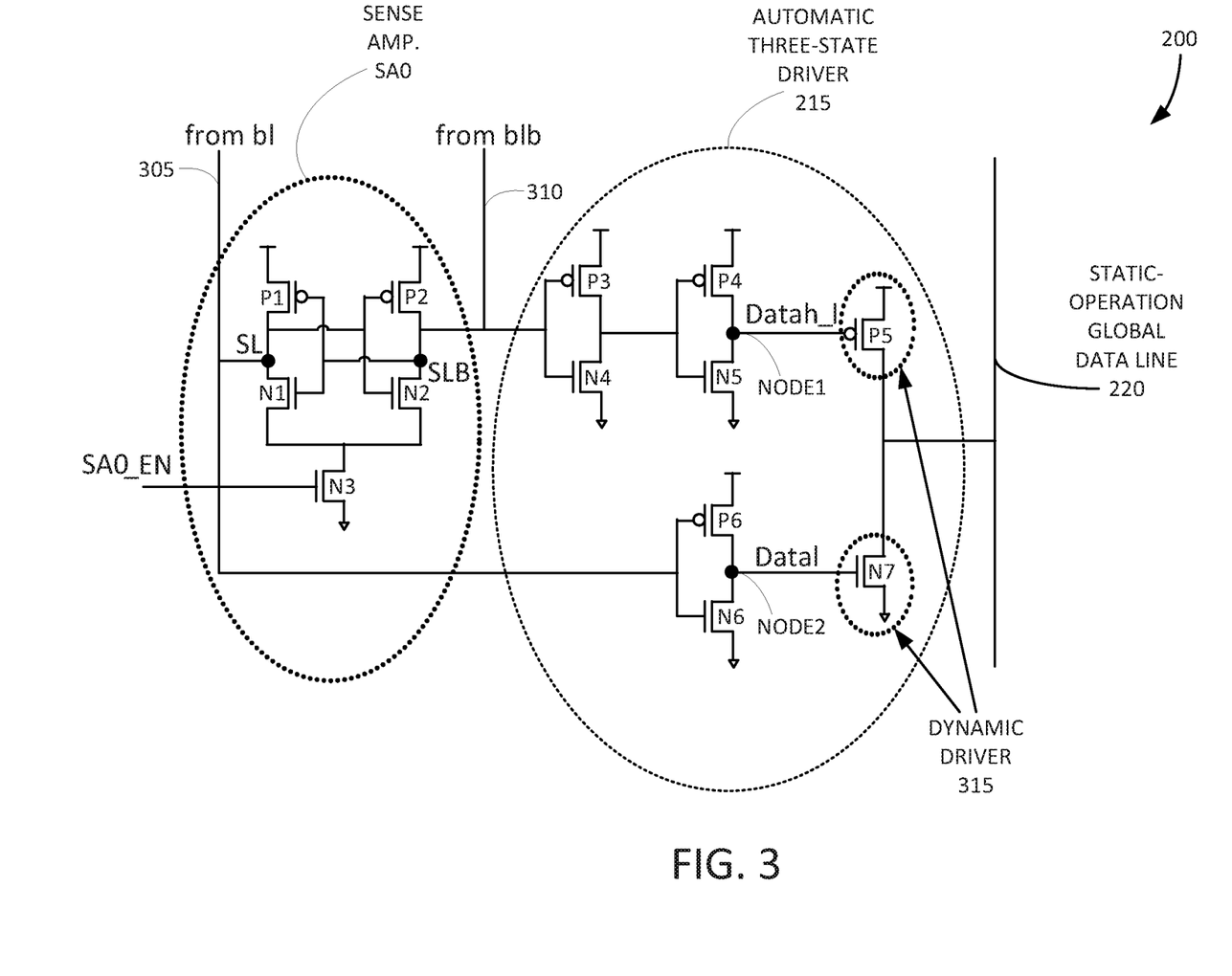
FIG. 3 illustrates details of the circuit of FIG. 2 in accordance with some embodiments disclosed herein.

FIG. 3 illustrates details of the circuit 200 of FIG. 2 in accordance with some embodiments disclosed herein. Specifically, the details of the sense amp SA0 of the section 205 of the circuit 200, and the automatic three-state driver 215 of the circuit 200 are shown. It will be understood that the sense amp SA1 of the section 230 is the same as or similar to the sense amp SA0, and therefore, the details of the sense amp SA1 are not shown. Similarly, the second automatic three-state driver 225 is the same as or similar to the first automatic three-state driver 215, and therefore, the details of the second automatic three-state driver 225 are not shown.

The sense amp SA0 can include a P-type transistor P1, a P-type transistor P2, an N-type transistor N1, an N-type transistor N2, and an N-type transistor N3. A node SL can be coupled to the transistor P1 and the transistor N1. The node SL can be coupled to a line 305 from a bit line (e.g., from bl). A node SLB can be coupled to the transistor P2 and the transistor N2. The node SLB can be coupled to a line 310 from a bit line (e.g., from blb). A gate of the transistor N3 can receive the SA0_EN input signal.

The automatic three-state driver 215 can include a P-type transistor P3, a P-type transistor P4, a P-type transistor P5, and a P-type transistor P6. The automatic three-state driver 215 can include an N-type transistor N4, an N-type transistor N5, an N-type transistor N6, and an N-type transistor N7. The transistor P4 and the transistor N5 can be coupled to a node NODE1. The transistor P6 and the transistor N6 can be coupled to a node NODE2. The transistors P5 and N7 comprise a dynamic driver 315. The transistor P5 and N7 of the dynamic driver 315 can be coupled to the nodes NODE1 and NODE2, respectively. The dynamic driver 315 can receive a Datah_1 signal at a gate of the transistor P5, and a Data1 signal at a gate of the transistor N7. The dynamic driver 315 can be coupled to the single-rail static-operation global data line 220. The single-rail static-operation global data line 220 may consume about ¼ of the power of a dual-rail dynamic-operation (i.e., pulsed signal) global data line, and may consume about ½ of the power of a single-rail dynamic-operation (i.e., pulsed signal) global data line.

The use of the dynamic driver 315 results in improved circuit speed because a dynamic gate is significantly faster than a static gate for a heavy loaded line. Moreover, the automatic three-state driver 215 need not have a gating signal (e.g., SEC_SEL of FIG. 1), which results in improved circuit speed, a reduction in the number of gates (i.e., reduced circuit area), and the removal of stack gate and timing complexity. In addition, the use of the single-rail static-operation global data line 220 improves routing channel availability, and may result in performance that is at least two times better than dual-rail.

More specifically, the circuit 200 can include the single-rail static-operation global data line 220 of an SRAM 202. The one or more automatic three-state drivers (e.g., 215, 225) can be coupled to the single-rail static operation global data line 220 of the SRAM 202. The circuit 200 can include one or more sense amplifiers (e.g., SA0, SA1) directly coupled to the one or more automatic three-state drivers (e.g., 215, 225), respectively. The circuit 200 can include one or more bit cells of one or more sub-arrays (e.g., Block 0, Block 1, Block 2, Block 3) coupled to the one or more sense amplifiers (e.g., SA0, SA1). The circuit 200 can include a latch 240 that is coupled to the single-rail static-operation global data line 220. In some embodiments, the latch is configured to receive a latch enable signal, and configured to not receive a pre-charge signal.

In some embodiments, the one or more automatic three-state drivers (e.g., 215, 225) include a first automatic three-state driver 215 coupled to the single-rail static-operation global data line 220 of the SRAM 202, a first sense amplifier SA0 directly coupled to the first automatic three-state driver 215, a second automatic three state driver 225 coupled to the single-rail static-operation global data line 220 of the SRAM 202, and a second sense amplifier SA1 directly coupled to the second automatic three-state driver 225.

In some embodiments, the first automatic three-state driver 215 includes a P-type transistor P3, a P-type transistor P4, an N-type transistor N4 coupled to the transistor P3, an N-type transistor N5 coupled to the transistor P4, a first node NODE1 coupled to the transistor P4 and to the transistor N5, a P-type transistor P5, a P-type transistor P6, an N-type transistor N6, an N-type transistor N7 coupled to the transistor P5, and a second node NODE2 coupled to the transistor P6 and to the transistor N6. In some embodiments, the first node NODE1 is directly coupled to a gate of the transistor P5, the second node NODE2 is directly coupled to a gate of the transistor N7, and the transistor P5 and the transistor N7 are directly coupled to the single-rail static-operation global data line 220.

In some embodiments, the first sense amplifier SA0 includes a P-type transistor P1, a P-type transistor P2, an N-type transistor N1, an N-type transistor N2, a first node SL coupled to the transistor P1 and to the transistor N1, and a second node SLB coupled to the transistor P2 and to the transistor N2. In some embodiments, the second node SLB is directly coupled to the transistor P3 and to the transistor N4 of the first automatic three-state driver 215.

In some embodiments, the second automatic three-state driver 225 includes a P-type transistor P3, a P-type transistor P4, an N-type transistor N4 coupled to the transistor P3, an N-type transistor N5 coupled to the transistor P4, a first node NODE1 coupled to the transistor P4 and to the transistor N5, a P-type transistor P5, a P-type transistor P6, an N-type transistor N6, an N-type transistor N7 coupled to the transistor P5, and a second node NODE2 coupled to the transistor P6 and to the transistor N6. In some embodiments, the first node NODE1 is directly coupled to a gate of the transistor P5, the second node NODE2 is directly coupled to a gate of the transistor N7, and the transistor P5 and the transistor N7 are directly coupled to the single-rail static-operation global data line 220.

In some embodiments, the second sense amplifier SA1 includes a P-type transistor P1, a P-type transistor P2, an N-type transistor N1, an N-type transistor N2, a first node SL coupled to the transistor P1 and to the transistor N1, and a second node SLB coupled to the transistor P2 and to the transistor N2. In some embodiments, the second node SLB is directly coupled to the transistor P3 and to the transistor N4 of the second automatic three-state driver 225.

Figure 4:
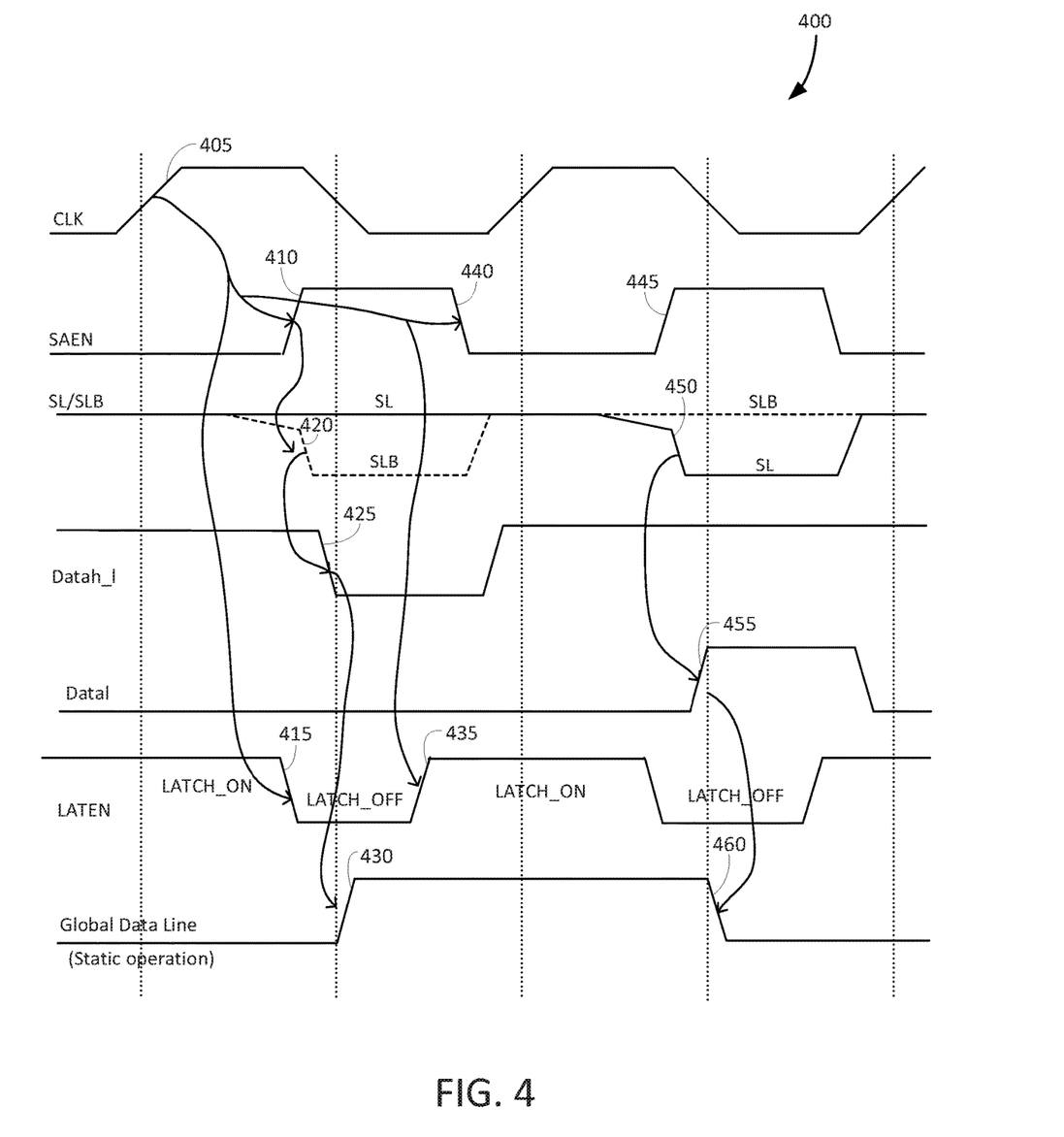
FIG. 4 illustrates a timing diagram in relation to the circuits of FIGS. 2 and 3 in accordance with some embodiments disclosed herein.

FIG. 4 illustrates a timing diagram 400 in relation to the circuits of FIGS. 2 and 3 in accordance with some embodiments disclosed herein. The timing diagram 400 includes a clock signal CLK, a sense amp enable SA_EN signal (e.g., SA0_EN and/or SA1_EN), a node SL, a node SLB, a Datah_1 signal, a Data1 signal, a latch enable LATEN signal, and a static-operation global data line signal. At 405, the clock signal CLK can transition to a high level, which can cause the sense amp enable SA_EN signal to transition to a high level at 410. In addition, the transition of the clock signal CLK to the high level can cause the latch enable LATEN signal to transition from a high level to a low level at 415, thereby turning the latch (e.g., 240 of FIG. 2) off.

After the SA_EN signal transitions to the high level at 410, the SL and SLB nodes can resolve to a particular high and/or low level, as shown at 420, which can cause the Datah_1 signal to transition from a high level to a low level at 425. The transition of the Datah_1 signal from the high level to the low level can cause the global data line to transition from a low level to a high level at 430. The LATEN signal can transition from the low level to the high level at 435, thereby turning the latch back on. The SA_EN signal can transition from the high level back to the low level at 440.

At 445, the SA_EN signal can transition from the low level to the high level. The SL and SLB nodes can resolve to a particular high and/or low level, as shown at 450, which can cause the Data1 signal to transition from the low level to the high level at 455, which can cause the global data line signal to transition from the high level to the low level at 460.

Figure 5:
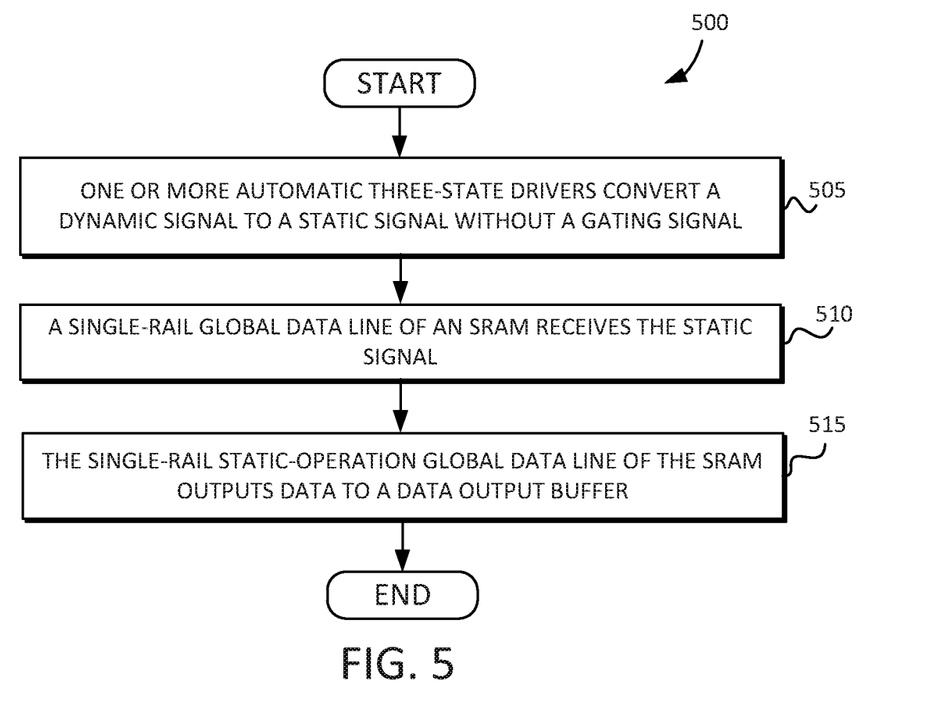
FIG. 5 is a flow diagram illustrating a technique for operating a global data line of multi-array SRAM in accordance with some embodiments disclosed herein.

FIG. 5 is a flow diagram 500 illustrating a technique for operating a global data line of multi-array SRAM in accordance with some embodiments disclosed herein. Reference is now made to FIGS. 2 and 5. At 505, one or more automatic three-state drivers (e.g., 215, 225) of the SRAM 202 convert a dynamic signal to a static signal without a gating signal (e.g., SEC_SEL). At 510, a single-rail static-operation global data line 220 of an SRAM 202 receives the static signal from the one or more automatic three-state drivers (e.g., 215, 225). At 515, the single-rail global data line 220 of the SRAM 202 outputs data to a data output buffer (e.g., 255).

The various operations of methods described above may be performed by any suitable means capable of performing the operations, such as various hardware and/or software component(s), circuits, and/or module(s).

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The following discussion is intended to provide a brief, general description of a suitable machine or machines in which certain aspects of the inventive concept can be implemented. Typically, the machine or machines include a system bus to which is attached processors, memory, e.g., RAM, ROM, or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present disclosure can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the present disclosure with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the present disclosure may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this present disclosure as defined in the claims.

What is claimed is:

1. A circuit, comprising:
   a single-rail static-operation global data line of a synchronous random access memory (SRAM); and
   one or more automatic three-state drivers coupled to the single-rail static operation global data line of the SRAM,
   wherein the one or more automatic three-state drivers includes:
      a first automatic three-state driver coupled to the single-rail static-operation global data line of the SRAM;
      a first sense amplifier directly coupled to the first automatic three-state driver;
      a first bit line directly coupled to the first sense amplifier and directly coupled to the first automatic three state driver;
      a second automatic three state driver coupled to the single-rail static-operation global data line of the SRAM;
      a second sense amplifier directly coupled to the second automatic three-state driver; and
      a second bit line directly coupled to the second sense amplifier and directly coupled to the second automatic three state driver.

2. The circuit of claim 1, further comprising one or more bit cells of one or more sub-arrays coupled to the one or more sense amplifiers.

3. The circuit of claim 1, further comprising a latch coupled to the single-rail static-operation global data line.

4. The circuit of claim 3, wherein the latch is configured to receive a latch enable signal, and configured to not receive a pre-charge signal.

5. The circuit of claim 1, wherein each of the first sense amplifier and the second sense amplifier includes:
   a P-type transistor P1;
   a P-type transistor P2;
   an N-type transistor N1;
   an N-type transistor N2;
   a first node coupled to the transistor P1 and to the transistor N1; and
   a second node coupled to the transistor P2 and to the transistor N2.

6. The circuit of claim 5, wherein each of the first and sense amplifier and the second sense amplifier includes an N-type transistor N3 coupled to the transistor N1 and to the transistor N2.

7. The circuit of claim 5, wherein the second node is directly coupled to the one or more automatic three-state drivers.

8. The circuit of claim 1, wherein each of the the first automatic three-state driver and the second automatic three-state driver includes:
   a P-type transistor P3;
   a P-type transistor P4;
   an N-type transistor N4 coupled to the transistor P3;
   an N-type transistor N5 coupled to the transistor P4; and
   a first node coupled to the transistor P4 and to the transistor N5.

9. The circuit of claim 8, wherein each of the first automatic three-state driver and the second automatic three-state driver further includes:
   a P-type transistor P5;
   a P-type transistor P6;
   an N-type transistor N6;

an N-type transistor N7 coupled to the transistor P5; and a second node coupled to the transistor P6 and to the transistor N6, wherein:

the transistor P3 and the transistor P4 of the first automatic three-state driver are directly coupled to a third bit line;

the transistor P3 and the transistor P4 of the second automatic three-state driver are directly coupled to a fourth bit line;

the transistor P6 and the transistor N6 of the first automatic three-state driver are directly coupled to the first bit line; and the transistor P6 and the transistor N6 of the second automatic three-state driver are directly coupled to the second bit line.

10. The circuit of claim 9, wherein the first node is directly coupled to a gate of the transistor P5.

11. The circuit of claim 10, wherein the second node is directly coupled to a gate of the transistor N7.

12. The circuit of claim 11, wherein the transistor P5 and the transistor N7 are directly coupled to the single-rail static-operation global data line.

13. The circuit of claim 1, wherein the first automatic three-state driver includes:
a P-type transistor P3;
a P-type transistor P4;
an N-type transistor N4 coupled to the transistor P3;
an N-type transistor N5 coupled to the transistor P4;
a first node coupled to the transistor P4 and to the transistor N5;
a P-type transistor P5;
a P-type transistor P6;
an N-type transistor N6;
an N-type transistor N7 coupled to the transistor P5;
a second node coupled to the transistor P6 and to the transistor N6, wherein:
the first node is directly coupled to a gate of the transistor P5;
the second node is directly coupled to a gate of the transistor N7; and
the transistor P5 and the transistor N7 are directly coupled to the single-rail static-operation global data line.

14. The circuit of claim 13, wherein the first sense amplifier includes:
a P-type transistor P1;
a P-type transistor P2;
an N-type transistor N1;
an N-type transistor N2;
a first node coupled to the transistor P1 and to the transistor N1; and
a second node coupled to the transistor P2 and to the transistor N2,
wherein the second node is directly coupled to the transistor P3 and to the transistor N4 of the first automatic three-state driver.

15. The circuit of claim 1, wherein the second automatic three-state driver includes:
a P-type transistor P3;
a P-type transistor P4;
an N-type transistor N4 coupled to the transistor P3;
an N-type transistor N5 coupled to the transistor P4;
a first node coupled to the transistor P4 and to the transistor N5;
a P-type transistor P5;
a P-type transistor P6;
an N-type transistor N6;
an N-type transistor N7 coupled to the transistor P5;
a second node coupled to the transistor P6 and to the transistor N6, wherein:
the first node is directly coupled to a gate of the transistor P5;
the second node is directly coupled to a gate of the transistor N7; and
the transistor P5 and the transistor N7 are directly coupled to the single-rail static-operation global data line:
the transistor P3 and the transistor P4 of the first automatic three-state driver are directly coupled to a third bit line;
the transistor P3 and the transistor P4 of the second automatic three-state driver are directly coupled to a fourth bit line;
the transistor P6 and the transistor N6 of the first automatic three-state driver are directly coupled to the first bit line; and
the transistor P6 and the transistor N6 of the second automatic three-state driver are directly coupled to the second bit line.

16. The circuit of claim 15, wherein the second sense amplifier includes:
a P-type transistor P1;
a P-type transistor P2;
an N-type transistor N1;
an N-type transistor N2;
a first node coupled to the transistor P1 and to the transistor N1; and
a second node coupled to the transistor P2 and to the transistor N2,
wherein the second node is directly coupled to the transistor P3 and to the transistor N4 of the second automatic three-state driver.

* * * * *